(12) United States Patent
Moon et al.

(10) Patent No.: US 9,040,972 B2
(45) Date of Patent: May 26, 2015

(54) ORGANIC LIGHT EMITTING DIODE (OLED) DISPLAY

(71) Applicant: SAMSUNG DISPLAY CO., LTD., Yongin, Gyeonggi-Do (KR)

(72) Inventors: Seung-Jun Moon, Yongin (KR); Hun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/044,850

(22) Filed: Oct. 2, 2013

(65) Prior Publication Data

US 2014/0138647 A1 May 22, 2014

(30) Foreign Application Priority Data

Nov. 16, 2012 (KR) .................. 10-2012-0130353

(51) Int. Cl.
*H01L 35/24* (2006.01)
*H01L 51/00* (2006.01)
*H01L 51/52* (2006.01)

(52) U.S. Cl.
CPC .................. *H01L 51/5246* (2013.01)

(58) Field of Classification Search
CPC .................................................. H01L 35/24
USPC .................. 257/40, 88, E27.121; 438/28
See application file for complete search history.

(56) References Cited

U.S. PATENT DOCUMENTS

| 2008/0164462 | A1* | 7/2008 | Lee et al. .................. 257/40 |
| 2009/0295277 | A1* | 12/2009 | Logunov et al. ............. 313/504 |
| 2010/0079065 | A1* | 4/2010 | Kamiura ................... 313/504 |
| 2010/0126898 | A1* | 5/2010 | Becken et al. ............. 206/524.1 |
| 2011/0175523 | A1 | 7/2011 | Kostka et al. |
| 2011/0249376 | A1* | 10/2011 | Wu ...................... 361/679.01 |
| 2013/0237115 | A1* | 9/2013 | Choi et al. ................. 445/25 |
| 2014/0175972 | A1* | 6/2014 | Lee et al. .................. 313/512 |

FOREIGN PATENT DOCUMENTS

| JP | 2007-253189 A | 10/2007 |
| KR | 10-2008-0067489 A | 7/2008 |
| KR | 10-1134608 B1 | 4/2012 |

OTHER PUBLICATIONS

Korean Patent Abstract, Publication No. 10-2012-0012672 A, dated Feb. 10, 2012 for corresponding Korean Patent 10-1134608.

* cited by examiner

*Primary Examiner* — Phuc Dang
(74) *Attorney, Agent, or Firm* — Christie, Parker & Hale, LLP

(57) ABSTRACT

An OLED display includes: a substrate including a display area with a plurality of pixels; an encapsulation substrate at the display area; and a sealant formed along an edge of the encapsulation substrate between the substrate and the encapsulation substrate to bond the substrate to the encapsulation substrate. The sealant includes a plurality of straight line portions and crossing portions formed by two straight line portions crossing each other.

5 Claims, 8 Drawing Sheets

ORGANIC LIGHT EMITTING DIODE (OLED) DISPLAY

CROSS-REFERENCE TO RELATED APPLICATION

This application claims priority to and the benefit of Korean Patent Application No. 10-2012-0130353 filed in the Korean Intellectual Property Office on Nov. 16, 2012, the entire content of which is incorporated herein by reference.

BACKGROUND

1. Field

The described technology relates generally to an organic light emitting diode (OLED) display.

2. Description of the Related Art

An organic light emitting diode (OLED) display is provided with a plurality of pixels, each including an organic light emitting diode and a driving circuit, to display an image. The organic light emitting diode is formed of a pixel electrode, a common electrode, and an organic emission layer between the pixel electrode and the common electrode.

Because a display function and a life-span characteristic are deteriorated when the organic light emitting element is exposed to external moisture and oxygen, an encapsulation layer is formed on the display portion to seal the display portion for reducing or blocking inflow of external air. For this, an encapsulation substrate is provided on an upper portion of a display area on the substrate, and a sealant is provided along an inner edge of the encapsulation substrate that faces toward the substrate so as to substantially seal the display area.

The sealant is formed by a frit melted by a laser beam and then cured. The laser beam used in a sealing process has Gaussian-shaped energy dispersion, and the laser beam is sequentially irradiated along a clockwise or counterclockwise direction from one point of the frit while a laser head emitting a laser beam or a stage supporting the substrate is moving.

However, the laser beam having the Gaussian dispersion has non-uniform energy dispersion at a cross-section thereof, thereby causing deterioration of shape uniformity of the sealant. In addition, the laser beam is irradiated along the plane shape of the sealant and thus energy difference occurs in inner and outer sides of the sealant during a curing process after melting, thereby causing generation of cracks. Here, the inner side of the sealant is an inner side facing the display area. The shape non-uniformity of the sealant and generation of cracks deteriorate sealing performance of the sealant, and the problems need to be solved.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an OLED display that can improve shape uniformity of a sealant, suppressing generation of cracks, and enhancing sealing performance of the sealant, and a method for manufacturing the same.

An OLED display according to an exemplary embodiment includes: a substrate including a display area with a plurality of pixels; an encapsulation substrate at the display area; and a sealant formed along an edge of the encapsulation substrate between the substrate and the encapsulation substrate to bond the substrate and the encapsulation substrate. The sealant includes a plurality of straight line portions and crossing portions formed by two of the straight line portions crossing each other.

The encapsulation substrate may include four side portions and four corner portions. The plurality of straight line portions may be formed in parallel with the respective side portions of the encapsulation substrate.

The straight line portions may include two parallel first straight line portions and two parallel second straight line portions crossing the first straight line portions. The crossing portions may be formed by the first straight line portions and the second straight line portions crossing each other corresponding to the respective corner portions of the encapsulation substrate.

The sealant may include a frit melted by a laser beam and then cured.

The laser beam may include a square-shaped spot and square-shaped cross-section energy dispersion for forming the sealant.

A method for manufacturing an OLED display according to another exemplary embodiment includes: coating a frit along an edge of an encapsulation substrate; coupling the encapsulation substrate at a substrate comprising a display area, such that the frit surrounds the display area; and forming a sealant by melting and curing the frit by applying a laser beam to the frit. The frit includes a plurality of straight line portions and crossing portions formed in a cross by two straight line portions crossing each other among the plurality of straight line portions.

The encapsulation substrate may include four side portions and four corner portions. The plurality of straight line portions may be formed in parallel with respect to corresponding side portions of the encapsulation substrate.

The plurality of straight line portions may include two parallel first straight line portions and two parallel second straight line portions crossing the first straight line portions. The crossing portions may be formed by the first straight line portions and the second straight line portions crossing each other.

The laser beam may be a single-mode laser beam including a square-shaped spot and square-shaped cross-section energy dispersion.

The laser beam may be irradiated by a laser generator, and the laser generator may include: a laser oscillator oscillating a laser beam; an optical converter and a square fiber providing a square-shaped single-mode laser beam with uniform energy dispersion of the laser beam; and a laser head focusing and irradiating the laser beam to the frit.

The ratio of a width of the laser beam to a width of the frit may be greater than or equal to 0.8 and less than or equal to 1.2.

As the shape of the sealant is enhanced and the square-shaped single-mode laser beam is used, the OLED display of the present exemplary embodiment improves shape uniformity of the sealant, suppresses generation of cracks, and enhances bonding strength of the substrate and the encapsulation substrate. Accordingly, the width of the sealant can be reduced and an external dead space of a display area can be reduced.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the specification, unless explicitly described to the contrary, the word "comprise" and variations such as "comprises" or "comprising" will be understood to imply the inclusion of stated elements but not the exclusion of any other elements. In addition, when it is said that any part, such as a layer, film, region, or plate, is positioned on another part, it means the part is directly on the other part or above the other part with at least one intermediate part. Further, in the specification, it means that an upper part of a target portion indicates an upper part or a lower part of a target portion, and it does not mean that the target portion is always positioned at the upper side based on a gravity direction.

Figure 1:
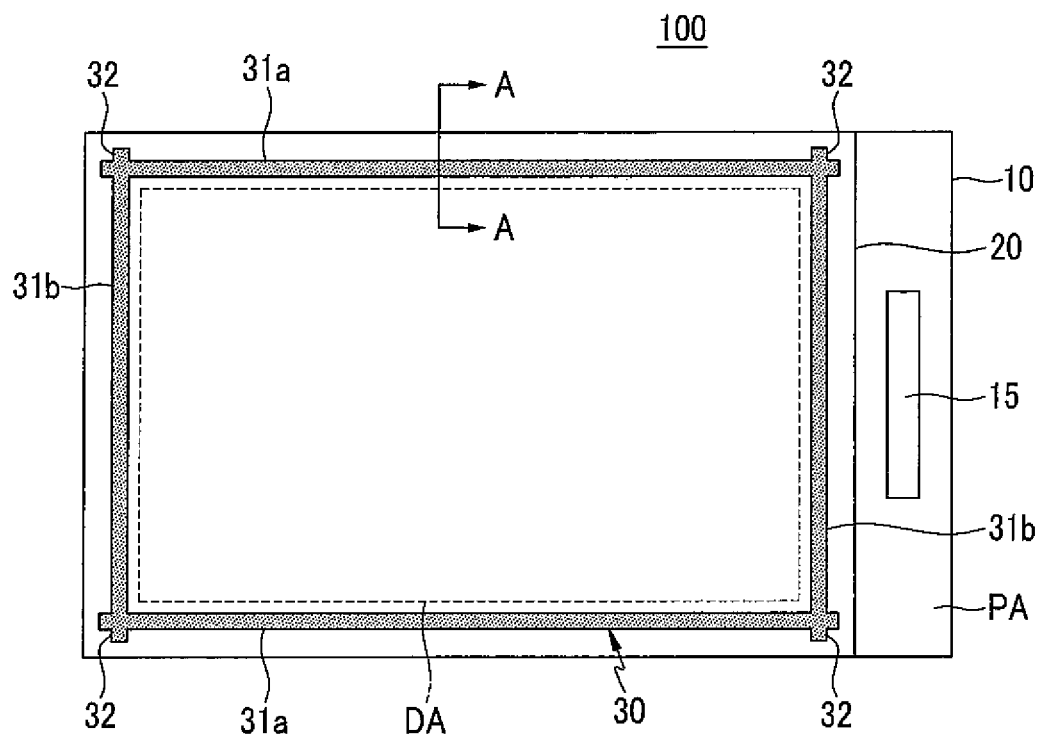
FIG. 1 is a schematic top plan view of an OLED display according to an exemplary embodiment.
Figure 2:
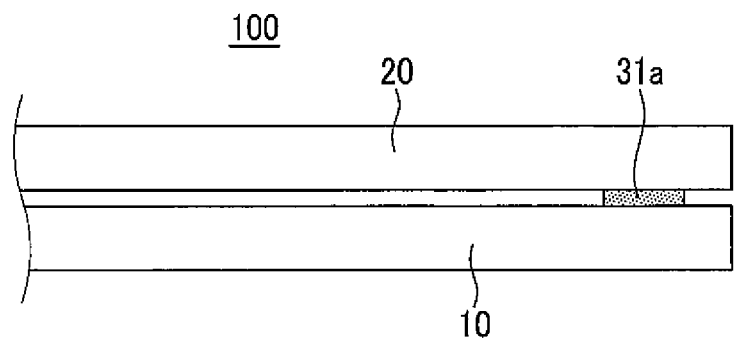
FIG. 2 is a schematic cross-sectional view of the OLED display of FIG. 1, taken along the line A-A.

FIG. 1 is a schematic top plan view of an organic light emitting diode (OLED) display according to an exemplary embodiment and FIG. 2 is a schematic cross-sectional view of the OLED display of FIG. 1, taken along the line A-A.

Referring to FIG. 1 and FIG. 2, an organic light emitting diode (OLED) display according to the present exemplary embodiment includes a substrate 10 provided with a display area DA where a plurality of pixels are formed, an encapsulation substrate 20 covering the display area DA, and a sealant 30 bonding the substrate 10 to the encapsulation substrate 20. The encapsulation substrate 20 and the sealant 30 substantially seal the display area DA to reduce or prevent inflow of external air.

The substrate 10 includes a display area DA and a pad area PA. A plurality of signal lines including a plurality of scan lines and a plurality of data lines and a plurality of pixels are provided in the display area DA of the substrate 10. A plurality of pad electrodes coupled with the plurality of signal lines are provided in the pad area PA of the substrate 10. An integrated circuit chip 15 may be mounted in the pad area PA of the substrate 10.

A scan driver (not shown) and a data driver (not shown) are provided in an outer side of the display area DA on the substrate 10. The scan driver supplies a scan signal to the plurality of pixels through the plurality of scan lines, and the data driver supplies a data signal to the plurality of pixels through the plurality of data lines. Each of the plurality of pixels includes an organic light emitting diode and a driving circuit, and an image is displayed in the display area DA using light emitted from the organic light emitting diode.

The encapsulation substrate 20 is formed smaller than the substrate 10 in size, and covers other portions of the substrate 10, excluding the pad area PA. The sealant 30 is located (e.g., formed or deposited) along the edge of the encapsulation substrate 20 between the substrate 10 and the encapsulation substrate 20 to integrally attach (e.g., bond) the substrate 10 to the encapsulation substrate 20. Light emitted from the organic light emitting diode is emitted to the outside through the substrate 10 or the encapsulation substrate 20, and one of the substrate 10 and the encapsulation substrate 20, which transmits light, is formed of a transparent substrate.

The sealant 30 is formed of a frit including micro glass particles. The frit in a gel or paste state is applied around the edges of the encapsulation substrate 20 and then receives laser beams to melt and cure the frit to form the sealant 30.

The micro glass particle of the frit may include at least one of magnesium oxide (MgO), calcium oxide (CaO), barium oxide (BaO), lithium oxide ($Li_2O$), boron oxide ($B_2O_3$), vanadium oxide ($V_2O_5$), zinc oxide (ZnO), lead oxide (PbO), tin oxide (SnO), phosphorous oxide ($P_2O_5$), ferrite oxide ($Fe_2O_3$), copper oxide (CuO), titanium oxide ($TiO_2$), tungsten oxide ($WO_3$), lead-borate glass, tin-phosphate glass, vanadate glass, or borosilicate.

Figure 3:
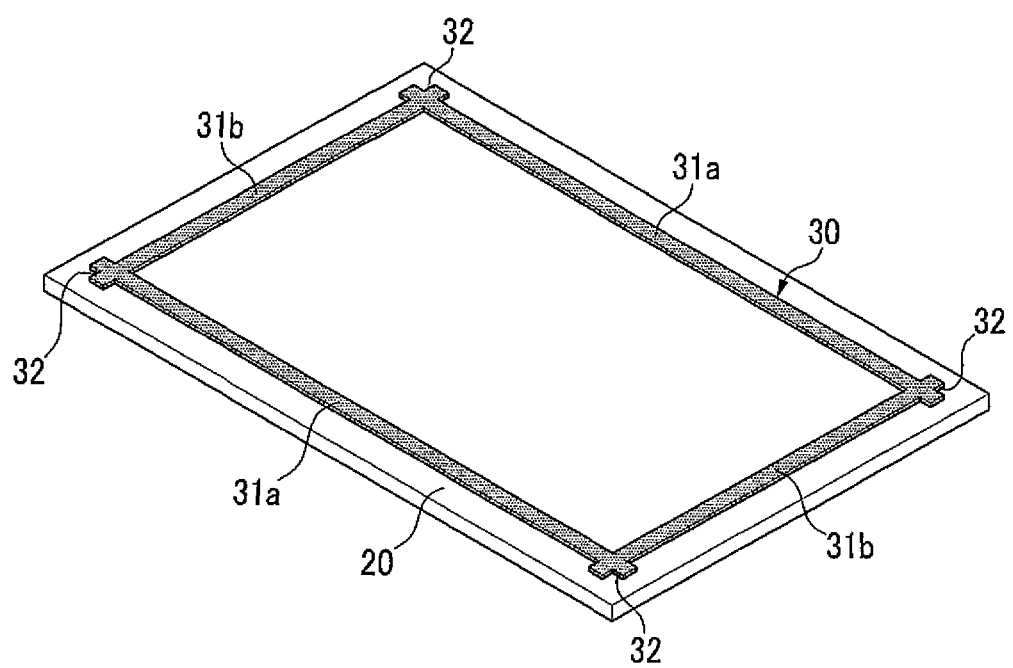
FIG. 3 is a schematic perspective view of an encapsulation substrate and a sealant of the OLED display of FIG. 1.

FIG. 3 is a schematic perspective view of the encapsulation substrate and the sealant of the OLED display of FIG. 1, with the sealant facing upward in the drawing. Referring to FIG. 1 to FIG. 3, the sealant 30 includes a plurality of straight line portions 31a and 31b and a crossing portion 32 formed in the shape of a cross by the two straight line portions 31a and 31b crossing each other among the plurality of straight line portions 31a and 31b.

In further detail, the encapsulation substrate 20 is formed as a rectangular shape including a pair of long sides and a pair of short sides, and the sealant 30 includes four straight line portions 31a and 31b corresponding to the four sides of the encapsulation substrate 20. The straight line portions 31a and 31b are parallel with respect to the sides of the encapsulation substrate 20 at a distance (e.g., a predetermined distance) therefrom, and have substantially constant widths.

The two straight line portions (hereinafter, referred to as first straight line portions 31a) corresponding to the long sides of the encapsulation substrate 20 contact the two straight line portions (hereinafter, referred to as second straight line portions 31b) corresponding to the short sides of the encapsulation substrate 20 at one point while forming a right angle. In this case, the first straight line portions 31a and the second straight line portions 31b further extend toward the edge of the encapsulation substrate 20 over the point where the two line portions contact each other and then cross each other in the shape of a cross.

The first straight line portions 31a are longer than the sum of the widths of the second straight line portions 31b and the distance between the second straight line portions 31b. The second straight line portion 31b may be longer than the sum of the widths of the first straight line portions 31a to the distance between the first straight lie portions 31a. Thus, cross-shaped crossing portions 32 are formed in four crossing areas where the first straight line portions 31a and the second straight line portions 31b cross each other. The crossing portions 32 respectively correspond to the four corners of the encapsulation substrate 20.

The sealant 30 is formed using a single-mode laser beam having square-shaped energy dispersion rather than using a laser beam having a Gaussian-type energy dispersion.

The square-shaped single-mode laser beam has uniform energy dispersion in a cross-section thereof, and therefore the frit can be uniformly melted by applying uniform energy to the frit along the width direction of the frit. Thus, the complete sealant 30 has excellent uniformity along the width direction, and has a substantially constant width.

The cross-shaped crossing portion 32 disperses heat condensed to one spot where the first straight line portion 31a and the second straight line portion 31b contact each other, and increases bonding strength of the substrate 10 and the encapsulation substrate 20 by extending the entire length of the sealant 30. In addition, the cross-shaped crossing portion 32 does not cause an energy difference between the inner and outer sides of the sealant 30 when being irradiated with the laser beam, and therefore generation of cracks in the sealant 30 due to the energy difference can be reduced or prevented.

Figure 4:
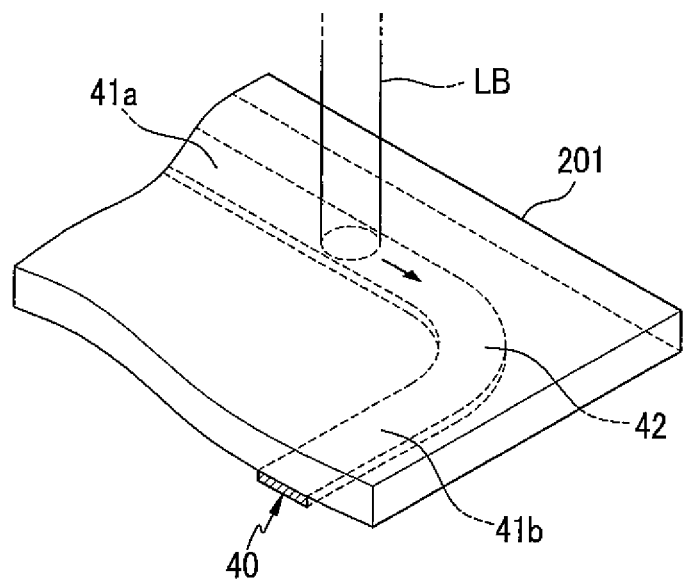
FIG. 4 is a schematic perspective view of an encapsulation substrate and a part of a sealant of an OLED display of a comparative example.

FIG. 4 is a schematic perspective view of a part of an encapsulation substrate and a sealant of an OLED display of a comparative example.

Referring to FIG. 4, a sealant 40 in an OLED display of the comparative example includes a first straight line portion 41a, a second straight line portion 41b, and a curved line portion 42 coupling the two straight line portions 41a and 42b. A frit coated to an encapsulation substrate 201 receives a laser beam LB and then is melted by the energy of the laser beam LB, and the laser beam LB moves clockwise or counterclockwise direction from one point of the frit.

Because an inner side length and an outer side length toward a display area are different from each other in the curved line portion 42, a difference between energy applied to the inner side and energy applied to the outer side of the curved line portion 42 occurs when the laser beam LB melts the frit while moving along the curved line portion 42. Due to such an energy difference, a crack may be formed in the outer surface of the sealant 40, which reduces or deteriorates sealing performance of the sealant 40.

Referring back to FIG. 3, the OLED display 100 of the present exemplary embodiment is provided with the cross-shaped crossing portions 32, instead of the curved line portion of the comparative example. The crossing portion 32 only has a straight line, and the laser beams also moves straight forward corresponding to the shape of the coated frit. Thus, unlike the comparative example, the crossing portion 32 of the present exemplary embodiment does not cause an energy difference between the inner and the outer sides of the sealant 30 so that generation of cracks due to the energy difference can be effectively reduced or prevented.

Figure 5:
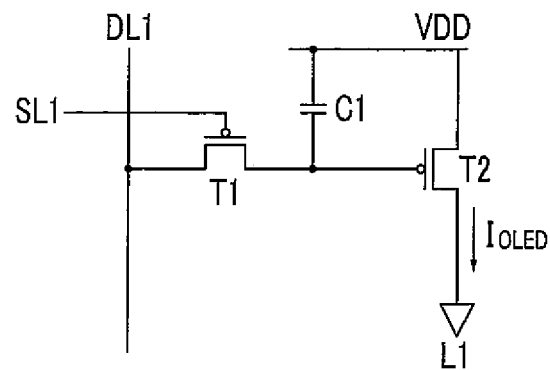
FIG. 5 schematically shows a pixel circuit of the OLED display of FIG. 1.
Figure 6:
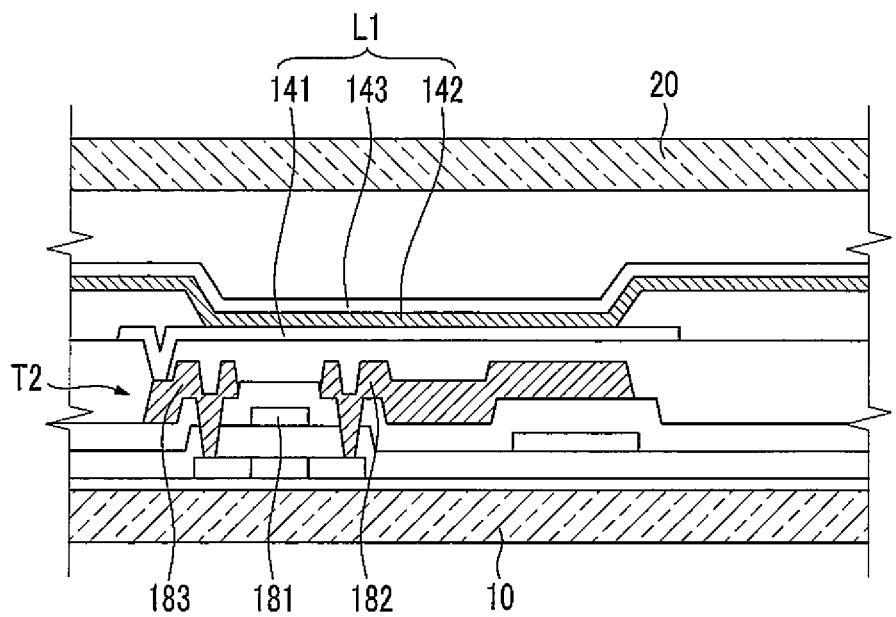
FIG. 6 is a partially enlarged schematic cross-sectional view of the OLED display of FIG. 1.

FIG. 5 schematically shows a pixel circuit of the OLED display of FIG. 1, and FIG. 6 is a partially enlarged schematic cross-sectional view of the OLED display of FIG. 1.

Referring to FIG. 5 and FIG. 6, a pixel includes an organic light emitting diode L1 and driving circuits T1, T2, and C1. The organic light emitting diode L1 includes a pixel electrode 141, an organic emission layer 142, and a common electrode 143. The driving circuits T1, T2, and C1 include at least two thin film transistors (i.e., a switching transistor T1 and a driving transistor T2) and at least one capacitor C1.

The switching transistor T1 is coupled to a scan line SL1 and a data line DL1, and transmits a data voltage, input from a data line DL1 according to a switching voltage input to the scan line SL1, to the driving transistor T2. The capacitor C1 is coupled to the switching transistor T1 and a power source line VDD, and stores a voltage corresponding to a difference between a voltage transmitted from the switching transistor T1 and a voltage supplied to the power source line VDD.

The driving transistor T2 is coupled to the power source line VDD and the capacitor C1 to supply an output current $I_{OLED}$ proportional to a square of a difference between the voltage stored in the capacitor C1 and a threshold voltage to the organic light emitting diode L1, and the organic light emitting diode L1 emits light with intensity proportional to the output current $I_{OLED}$. The driving transistor T2 includes a gate electrode 181, a source electrode 182, and a drain electrode 183, and a pixel electrode 141 may be coupled to the drain electrode 183 of the driving transistor T2.

The cross-sectional structures of the pixel circuit of FIG. 5 and the OLED display of FIG. 6 are not limited thereto, and the OLED display of the present exemplary embodiment can be variously deformed.

Next, a method for manufacturing an OLED display will be described.

Figure 7:
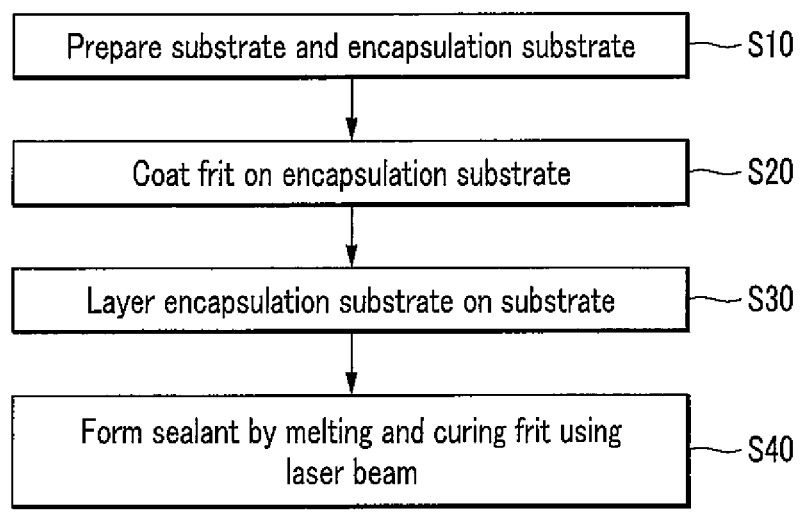
FIG. 7 is a flowchart of a manufacturing process of an OLED display according to an exemplary embodiment.

FIG. 7 is a flowchart of a manufacturing method of an OLED display according to an exemplary embodiment.

Referring to FIG. 7, the manufacturing method of the OLED display includes a first step (S10) for preparing a substrate and an encapsulation substrate, a second step (S20) for coating a frit along the edge of the encapsulation substrate, a third step (S30) for layering the encapsulation substrate on the substrate such that the frit surrounds a display area of the substrate, and a fourth step (S40) for forming a sealant by applying a laser beam to the frit to melt and cure the frit.

In the first step (S10), the substrate is provided with a display area and a pad area, and the encapsulation substrate may be equivalent to other portions of the substrate, excluding the pad area in size. In the second step (S20), the frit includes a plurality of straight line portions and crossing portions formed in the shape of a cross by two straight lines crossing each other among the plurality of straight lines. In the step S40, the laser beam is formed of a single-mode laser beam having square-shaped energy dispersion.

Figure 8:
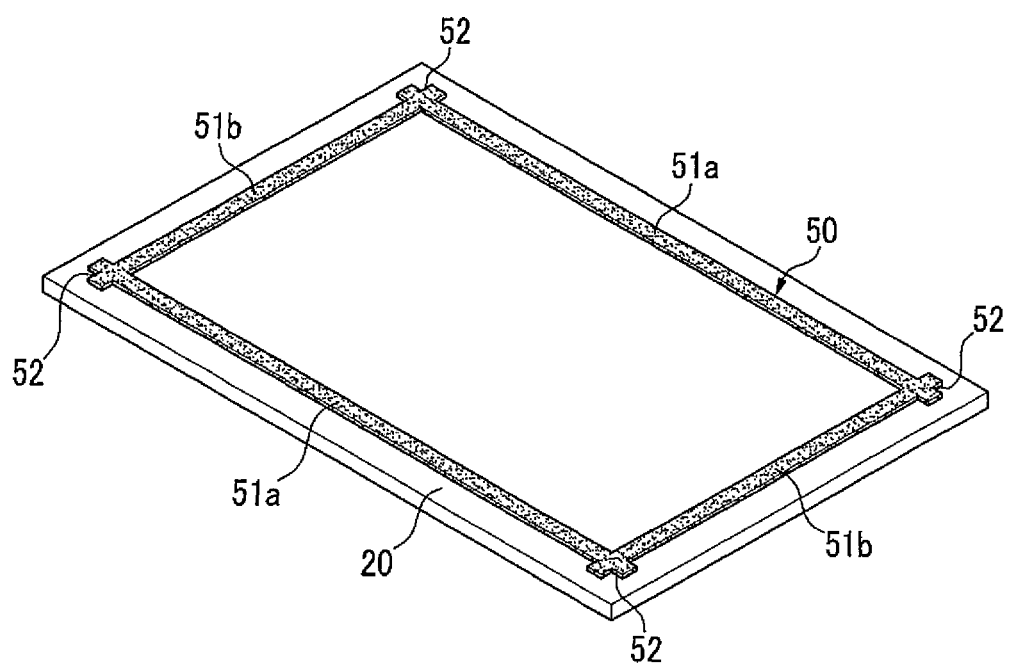
FIG. 8 is a schematic perspective view of an encapsulation substrate of the second process of FIG. 7.

FIG. 8 is a schematic perspective view of the encapsulation substrate in the second step of FIG. 7.

Referring to FIG. 8, the frit 50 includes micro glass particles, and coated in a gel or paste state around (or along) the edge or a periphery of the encapsulation substrate 20. The frit 50 includes four straight line portions 51a and 51b corresponding to four sides of the encapsulation substrate 20 and four crossing portions 52 corresponding to four corner portions of the encapsulation substrate 20. The crossing portion 52 is formed in the shape of a cross by two straight line portions 51a and 51b perpendicularly crossing each other.

The micro glass particles of the frit 50 may include at least one of magnesium oxide (MgO), calcium oxide (CaO), barium oxide (BaO), lithium oxide ($Li_2O$), boron oxide ($B_2O_3$), vanadium oxide ($V_2O_5$), zinc oxide (ZnO), lead oxide (PbO), tin oxide (SnO), phosphorous oxide ($P_2O_5$), ferrite oxide ($Fe_2O_3$), copper oxide (CuO), titanium oxide ($TiO_2$), tungsten oxide ($WO_3$), lead-borate glass, tin-phosphate glass, vanadate glass, or borosilicate.

Figure 9:
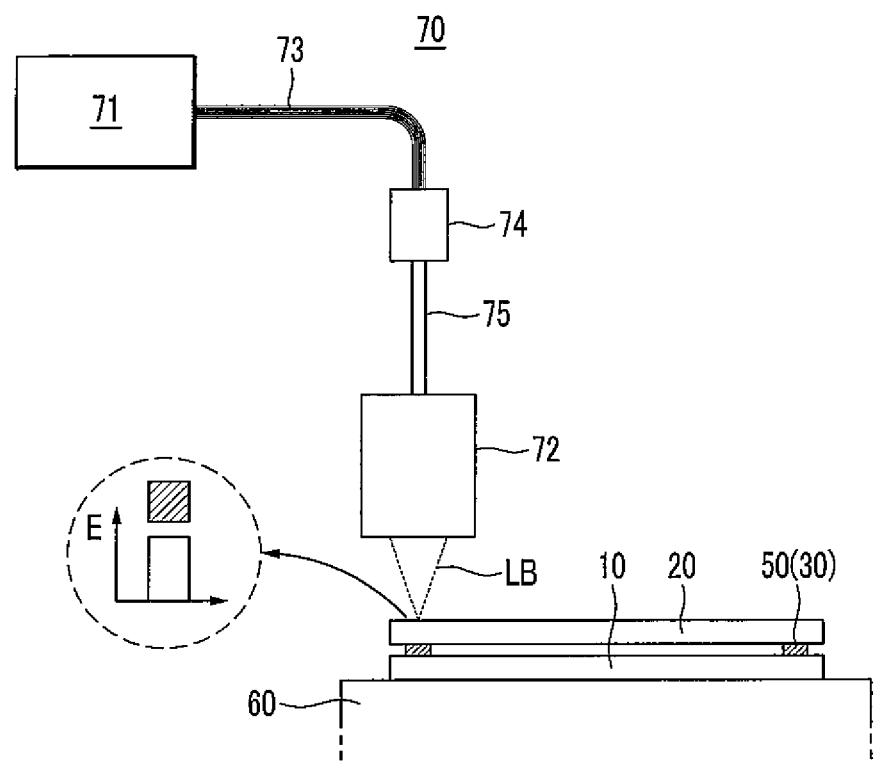
FIG. 9 is a schematic diagram of the OLED display of the fourth process of FIG. 7.
Figure 10:
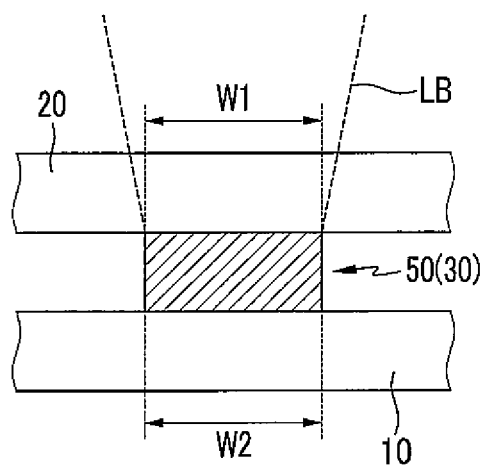
FIG. 10 is a partially enlarged schematic view of FIG. 9.

FIG. 9 is a schematic diagram of the OLED display of the fourth step in FIG. 7, and FIG. 10 is a partially enlarged view of FIG. 9.

Referring to FIG. 9 and FIG. 10, in the fourth step S40, the substrate 10 and the encapsulation substrate 20 are mounted to a stage 60, and a laser generator 70 is provided on the encapsulation substrate 20. The laser generator 70 includes a laser oscillator 71 and oscillates a laser beam LB. An optical fiber bundle 73 is coupled with the laser oscillator 71. An optical converter 74 provides square-shaped single-mode laser beams by providing uniform energy dispersion. A square fiber 75 and a laser head 72 focus and irradiate the laser beam LB to the frit 50.

The laser beam LB oscillating from the laser oscillator 71 and then passing through the optical fiber bundle 73 does not have uniform energy dispersion at a cross-section of the optical fiber bundle 73. The non-uniform energy dispersion of such a laser beam LB is made substantially uniform after passing through the optical converter 74 and the square fiber 75. The square fiber 75 is formed of a square-shaped single core cable, and has a squared beam spot shape and thus realizes a laser beam of which energy dispersion in a cross-section is square-shaped. The laser head 72 is provided with at least one focusing lens to focus the laser beam.

FIG. 9 schematically illustrates the laser beam irradiated to the frit in the enlarged circle. The spot shape of the laser beam LB irradiated to the frit 50 is square-shaped, and the energy dispersion shape of the cross-section is not Gaussian dispersion but square-shaped so that the energy dispersion in the cross-section of the frit 50 is uniform. Thus, the laser beam LB uniformly melts by applying uniform energy to the frit 50, and accordingly, a sealant 30 has excellent shape uniformity along a width direction.

A width W1 (e.g., referring to FIG. 10) of the laser beam LB focused to the frit 50 may be equivalent to a width W2 (e.g., referring to FIG. 10) of the frit coated to the encapsulation substrate 20 or may be different within an error range (e.g., a predetermined error range). The width W1 of the laser beam LB and the width W2 of the frit 50 may satisfy the following condition 1:

$$0.8 \leq W1/W2 \leq 1.2 \qquad 1$$

When the width W1 of the laser beam LB is 0.8 times less than the width W2 of the frit 50, a valid width of the sealant 30 is decreased and thus adherence is deteriorated, and accordingly the sealant 30 may be separated from the substrate 10 and the encapsulation substrate 20. On the other hand, when the width W1 of the laser beam LB exceeds 1.2 times the width W2 of the frit 50, wiring in the periphery area of the sealant 30 may be thermally damaged, and the substrate 10 and the encapsulation substrate 20 may be damaged (e.g., broken) during a cutting process.

In the fourth step (S40), the laser beam LB is sequentially irradiated to the frit 50 from one point of the frit 50 along a length direction of the frit 50. For this, the laser head 72 or the stage 60 changes a relative position of the frit 50 and the laser beam LB while being moved.

In this case, the frit 50 is not provided with a curved line portion unlike the OLED display device of the comparative example shown in FIG. 4, and therefore the laser beam LB is straightly irradiated along the frit 50. Accordingly, an energy difference between the inner and the outer sides of the frit 50 during the melting and curing process is reduced, thereby effectively reducing or preventing generation of cracks that would otherwise be caused by a difference in the amount of energy applied to the inner and outer sides of the frit 50.

In addition, the cross-shaped crossing portion 52 can disperse heat concentrated to crossing portions where the two straight line portions 51a and 51b contact each other, and a bonding strength between the substrate 10 and the encapsulation substrate 20 can be increased by extending a bonding area of the substrate 10 and the encapsulation substrate 20.

With the above-stated shape of the sealant 30 and the square-shaped single-mode laser beam, the OLED display 100 according to the present exemplary embodiment can increase the shape uniformity of the sealant 30, suppress generation of cracks, and enhance bonding strength between the substrate 10 and the encapsulation substrate 20. As a result, the width of the sealant 30 can be reduced and a dead space in an outer side of the display area DA can be reduced.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

<Description of Some of the Reference Symbols>

| | |
|---|---|
| 100: OLED display | 10: substrate |
| 20: encapsulation substrate | 30: sealant |
| 31a, 31b: straight line portion | 32: crossing portion |
| 50: frit | |

What is claimed is:

1. An organic light emitting diode (OLED) display comprising:
    a substrate comprising a display area with a plurality of pixels;
    an encapsulation substrate at the display area; and
    a sealant formed along a periphery of the encapsulation substrate between the substrate and the encapsulation substrate to bond the substrate to the encapsulation substrate,
    wherein the sealant comprises,
    a plurality of straight line portions and
    crossing portions formed by two of the straight line portions crossing each other,
    wherein each of the crossing portions is formed in the shape of a cross.

2. The OLED display of claim 1, wherein the encapsulation substrate comprises four side portions and four corner portions, and the straight line portions are in parallel with the respective side portions of the encapsulation substrate.

3. The OLED display of claim 2, wherein the straight line portions comprise two parallel first straight line portions and two parallel second straight line portions crossing the first straight line portions, and the crossing portions comprise the first straight line portions and the second straight line portions crossing each other.

4. The OLED display of claim 1, wherein the sealant comprises a frit melted by a laser beam and then cured.

5. The OLED display of claim 4, wherein the laser beam comprises a single mode laser beam with a square-shaped spot and square-shaped cross-section energy dispersion for forming the sealant.

* * * * *